United States Patent
Burkhard et al.

(10) Patent No.: US 6,266,351 B1
(45) Date of Patent: Jul. 24, 2001

(54) GENERATOR FOR PRODUCING A HIGH-FREQUENCY, LOW-NOISE SIGNAL

(75) Inventors: Herbert Burkhard, Darmstadt; Hansjoerg Schoell, Griesheim, both of (DE); Mario Tamburrini, Rome (IT)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/194,471
(22) PCT Filed: May 23, 1997
(86) PCT No.: PCT/DE97/01054
  § 371 Date: Nov. 30, 1998
  § 102(e) Date: Nov. 30, 1998
(87) PCT Pub. No.: WO97/47080
  PCT Pub. Date: Dec. 11, 1997

(30) Foreign Application Priority Data

May 30, 1996 (DE) ............................... 196 21 600

(51) Int. Cl.[7] .................................... H10S 3/13
(52) U.S. Cl. ................................. 372/32; 372/75
(58) Field of Search .................. 372/28, 132, 75

(56) References Cited

U.S. PATENT DOCUMENTS

| | | | |
|---|---|---|---|
| 4,962,502 | * 10/1990 | Adams | 372/8 |
| 5,027,435 | * 6/1991 | Chraplyvy | 455/617 |
| 5,153,888 | 10/1992 | Imamura et al. | |
| 5,949,562 | * 9/1999 | Kubota | 359/124 |

FOREIGN PATENT DOCUMENTS

WO 93/16514   8/1993 (WO).

OTHER PUBLICATIONS

Wake, D. et al., "Optical Generation of Millimeter–Wave Signals for Fiber–Radio Systems Using a Dual–Mode DFB Semiconductor Laser," IEEE Transactions on Microwave Theory and Techniques, vol. 43, No. 9, Part 2, Sep. 1995, pp. 2270–2276.

Novak, D. et al., "Signal Generation Using Pulsed Semiconductor Lasers for Application in Millimeter–Wave Wireless Links," IEEE Transactions On Microwave Theory And Techniques, vol. 43, No. 9, Part. 02, Sep. 1, 1995, 2257–2262.

Trommer, D. et al., "Multi–Purpose Dual Tunable Laser/Combiner PIC Based on InP," Proceedings Of The 21st European Conference on Optical Communications, ECOC'95, vol. 1, Sep. 17–21, 1995, Gent, Belgien, pp. 83–86.

Goldberg, Y. et al., "35 GHz Microwave Signal Generation With An Injection–Locked Laser Diode," Electronics Letters, vol. 21, No. 18, Aug. 29, 1985, UK, pp. 814–815.

* cited by examiner

Primary Examiner—Teresa M. Arroyo
Assistant Examiner—Gioacchino Inzirillo
(74) Attorney, Agent, or Firm—Kenyon & Kenyon

(57) ABSTRACT

A generator for producing a low-noise, high-frequency signal has a monomode first laser connected via an optical isolator to a second laser so as to permit light generated by the fist laser to be injected into the second laser. The difference in the frequencies of the lasers and the intensity of the injected light is selected so as to prevent the second laser from locking onto the free-running frequency of the first laser.

13 Claims, 3 Drawing Sheets

GENERATOR FOR PRODUCING A HIGH-FREQUENCY, LOW-NOISE SIGNAL

FIELD OF THE INVENTION

The invention is directed to a generator for producing a low-noise, high-frequency signal, a monomode fob laser being connected via an optical isolator to a second laser, and light produced by the first laser being injected into the second laser.

RELATED TECHNOLOGY

Microwave-based radio-communication systems require carrier frequencies in the range of 10 GHz and higher. Radio-communication systems of this kind are used, for example, to supplement permanently cabled subscriber lines in the form of wireless local loops (WLL). These systems are suited for providing customers with new communications services quickly, flexibly and at low cost.

Various methods for producing high-frequency carriers have become known For example, L. Goldberg, A. M. Yurek, H. F. Taylor, and J. F. Weller discuss locking a Fabry-Perot laser onto an injected sideband in "35 GHz Microwave Signal Generation with an Injection-Locked Laser Diode", Electron. Lett., vol, 21, pp 630631, 1985. Also, D. Wake, C. R. Lima and P. A. Davies describe a high-frequency, driven dual-mode laser having distributed feedback in "Optical Generation of Millimeter-Wave Signals for Fiber-Radio Systems using a Dual-Mode DFB Semiconductor Lascr", IEEE Trans. Microwave Theory and Techn., vol 43, pp. 2270–2276, 1995. Also known from D. Novak, Z. Ahnmed, R. B. Waterhouse and R. S. Tucker in "Signal Generation Using Pulsed Semiconductor Lasers for Application in Millimeter-Wave Wireless Links", IEEE Trans. Microwave Theory and Techn., vol 43, pp 2257–2262, 1995 is an optically filtered mode locking of laser diodes.

In addition, D. Trommer, R. Kaiser, R. Stenzel, H. Heidrich in "Multi-Purpose Laser/Coinbiner PIC Based in InP", Proc. ECOC '95, paper Mo.B.4.2, pp. 83–86, 1995, describe superpositioning two independent laser lines.

Various drawbacks are associated with the known methods Either they require additional electrical microwave injection or they are too noisy for use in radio-communication systems. Only when it comes to the subject matter of the last-named publication is a continuous tuning of the generated optical microwave frequencies possible. On the other hand, however, the noise is quite intense with this method.

A device is also known from WO 93116514 A1 for changing the frequency of light signals, whereby a source light signal is supplied to an input of a self-pulsing laser diode. In this context, the frequency of the laser diode matches that of the source signal ox of a harmonic of the same. The purpose of the arrangement is to produce different modulation frequencies of the light emitted by the laser.

SUMMARY OF THE INVENTION

An object of the present invention, therefore, is to devise a generator for producing a carrier or other high-frequency signal that is substantially low-noise, with the least possible outlay.

The present invention provides a monomode first laser is connected via an optical isolator to a second laser so as to permit light generated by the first laser to be injected into the second laser. The difference in the frequencies of the lasers and the intensity of the injected light is selected so as to prevent the second laser from locking onto the free-running frequency of the first laser, and so as to ensure that the second laser oscillates at a frequency that differs slightly from the free-running frequency and that its output signal exhibits a substantial modulation depth, with a modulation frequency of about the difference in the frequency of the two free-running lasers.

In one advantageous embodiment of the generator according to the present invention, the firs laser is a laser having an external resonator, or external cavity laser (ECL). This enables the generated frequency to be tuned effectively. For applications where such a tuning capability, in particular a large tuning range, is not required, a different laser, for example a laser having distributed feedback, would also be suited for use as the first laser and is within the scope of the present invention.

Another advantageous embodiment of the generator of the present invention provides for the second laser to be a laser having distributed feedback (DFB).

To generate a carrier frequency for microwave radiocommunication systems, a further development of the generator according to the present invention provides for a photoelectric transducer to be connected to the output of the second laser, the output of the second laser and the input of the photoelectric transducer preferably being linked via an optical isolator.

In this specific embodiment of the generator according to the present invention, the carrier modulation may be performed on the electrical level. Provision may also be made, however, for an optical modulator to be connected in series to the photoelectric transducer. As a result, the already modulated microwave signal is able to be carried over large distances, with low loss, using an optical waveguide, and not be converted into an electrical signal until the point of radiation.

Another field of application of the generator according to the present invention is producing extremely high frequency signals to be modulated, which are transmitted optically. To this end, the design of the generator according to the present invention may be such that the first laser is modulated with a frequency corresponding to the frequency of the signal, the second laser is locked onto a sideband produced by the modulation, and the output signal of the second laser is able to be modulated with a digital modulation signal, whose clock pulse corresponds to the frequency used to modulate the first laser. The output signal from the second laser is thus synchronized to the frequency at which the first laser is modulated. Provision is preferably be made in his context for he modulated output signal of the second laser to be able to be fed to an optical transmission device According to another embodiment of the present invention, it is possible to modulate the generated signal by modulating the output signal from the first laser, using a signal fed to it, so that the generated signal is also modulated using the supplied signal The modulation of the output signal from the first laser may also be performed in addition to the modulation using a single sideband frequency. This embodiment may be designed with the first laser being modulated directly or with an external optical modulator being provided for modulation purposes. The modulation may be performed using both analog as well as digital signals.

Alternatively, to generate extremely high-frequency optical signals, provision can bc made for the output signal from the second laser to be able to be fed to an optical modulator and to a clock-pulse generator for providing a digital modulation signal for the optical modulator.

The present invention makes advantageous use of a property of the second laser, namely the property of producing an additional frequency besides a frequency corresponding substantially to the natural frequency of the second laser. This additional frequency arises when the differential frequency of the two lasers is selected to be greater than the locking range. This is caused by a change in (pulling of) of the mean optical frequency the field of the second laser, produced by injection. The output signal from the second laser can show oscillation frequencies of from 7 GHz to over 2 THz, both for positive as well as negative frequency differences. In practical applications, however, only frequencies of up to 45 GHz are measured, depending on the bandwidth of a connected photoelectric transducer. The line width at the (−3 dB) points is below 100 kHz when an ECL is used as a first laser. Using an interferometer and based on the generation of the second harmonic (SHG), frequencies of up to 2 THz having a modulation index of 90% have been measured.

BRIEF DESCRIPTION OF THE DRAWINGS

Exemplary embodiments of the invention are elucidated below on the basis of the drawings, in which.

DETAILED DESCRIPTION

Figure 1:
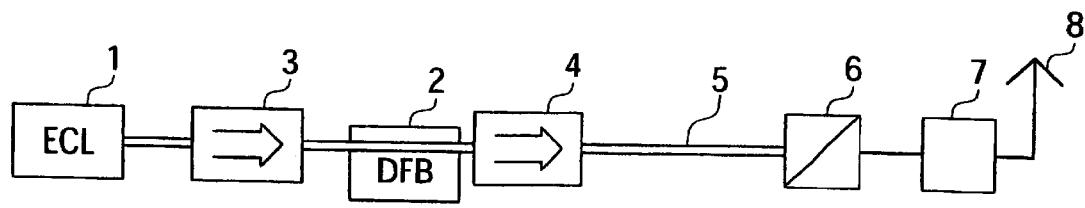
FIG. 1 shows an exemplary embodiment of the present invention designed for the generation of a microwave carrier.

In all the depicted exemplary embodiments, the output signal from a laser 1 having an external resonator is fed via an optical isolator 3 to a DFB laser 2, so that laser 1 is operated as a master laser and DFB laser 2 as a slave laser. On the side opposite the the laser launch facet of slave laser 2, the output signal from this laser is coupled out and fed via another optical isolator 4 and a fiber optic guide 5 to a photoelectric transducer 6, a transmitter 7 having an antenna 8 being connected thereto.

The functioning of the generator illustrated in FIG. 1 is elucidated in the following on the basis of FIGS. 6 through 8: FIG. 8 shows the dependency of the injection ratio required for locking slave laser 2 onto the frequency of master laser 1. Injection ratio Si/S is the ratio between the number of injected photons and the number of photons contained in the resonator of slave laser 2. Above curve 24, the slave laser locks onto the frequency of the master laser. The greater the frequency difference is, the greater the injection ratio required for locking.

The diagram covers the injection-ratio range from 0 to 1 and the frequency-difference range from −60 GHz to +60 GHz in terms of the frequency of the free-running slave laser of, for example, 200 THz, represented by a broken vertical line at d=O. If an injection is now made at a master-laser frequency that is 44 GHz less than the frequency of the free-running slave laser (see line 21) or 38 GHz higher (line 22), then there is no locking of the slave laser when the injection ratio is less than about 0.4. in both cases, the oscillation frequency that sets in is 40 GHz.

Figure 9:
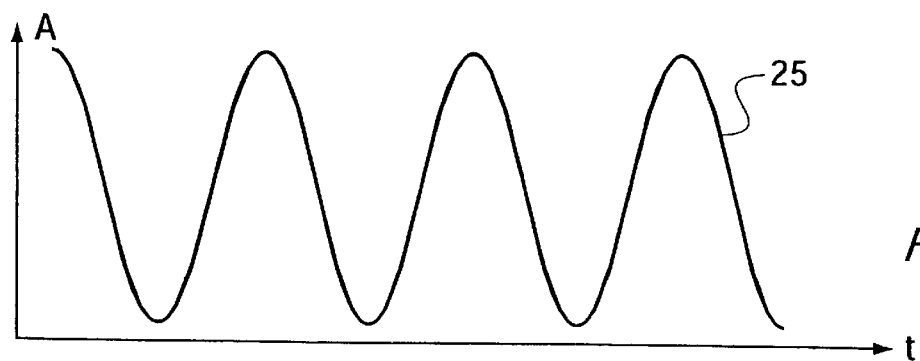
FIG. 9 shows the amplitude curve of the generated optical signal according to the present invention.
Figure 10:
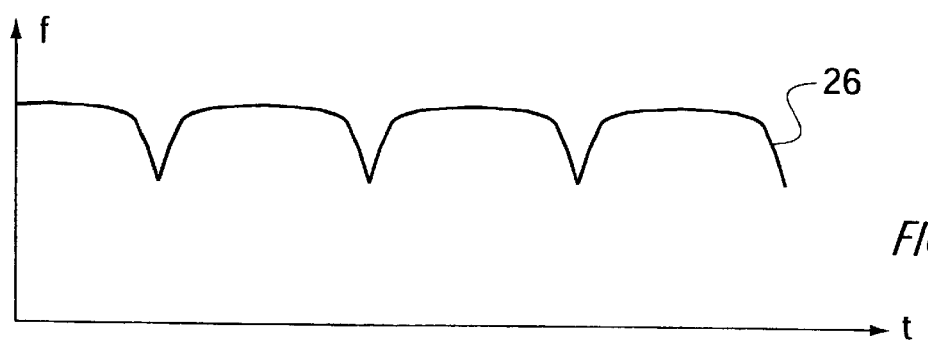
FIG. 10 shows the frequency curve according to the present invention In the Figures, equivalent parts have been given the same reference symbols. In the block diagrams of FIGS. 1 through 7, optical links are shown as double lines, and electrical links as single lines.

The slave laser then oscillates at a frequency that is slightly lower than that of the free-running slave laser. In response to an injected frequency 22, the slave laser oscillates at frequency 23; in response to an injected frequency 21, it oscillates at frequency 29. As is apparent from FIG. 9, the output signal having this frequency is modulated, to be specific, at a frequency of 40 GHz, which corresponds substantially to the frequency difference d between the free-running lasers. If the frequency difference and the injection ratio are at a point close to limit 24 of the locking range, the result is a significant modulation depth of virtually 100%, as shown by curve 25 of amplitude A in FIG. 9. In this context, frequency 23 of the slave laser is quite stable and changes only slightly in the time intervals when the photon density in laser 2 is close to zero (FIG. 10, curve 26).

What is significant about signal 25 is that it exhibits extremely low phase noise. If, at this point, this optical signal is fed to photoelectric transducer 6 (FIG. 1), then it, in turn, delivers an output signal having the corresponding frequency and likewise having extremely low phase noise. This signal can then be modulated in suitable fashion in transmitter 7 and broadcast via antenna 8.

Figure 2:
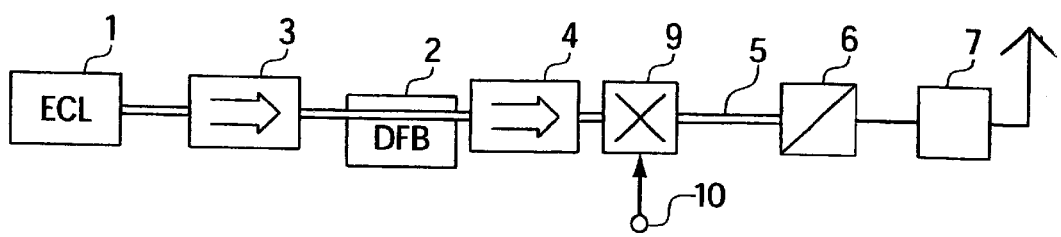
FIG. 2 shows a further embodiment of the present invention for generating a microwave carrier.

In the exemplary embodiment according to FIG. 2, the low-noise signal is generated in the same way as when working with the generator in FIG. 1. However, modulation of a signal fed at 10 is performed in an optical modulator 9 on the optical level. The premodulated optical signal can then be distributed via an optical line network (shown in FIG. 2 by a single line 5), if necessary to a plurality of photoelectric transducers 6, each having a transmitter 7 and an antenna 8 connected thereto.

Figure 3:
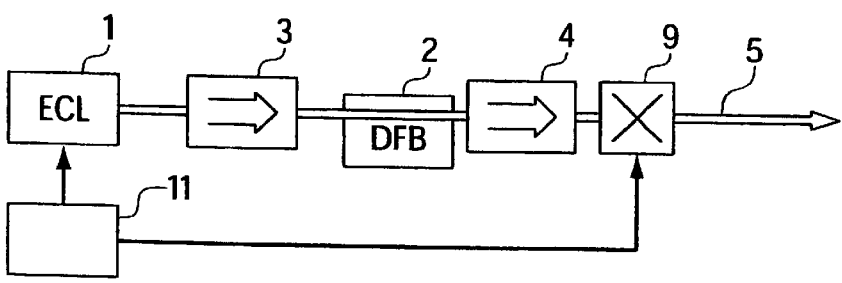
FIG. 3 shows an embodiment of the present invention for generating a high-frequency optical signal.

In the exemplary embodiment according to FIG. 3, master laser 1 is modulated using he clock frequency of a digital signal generated at 11, which is used, in turn, to modulate the optical output signal. When master laser I is modulated, for example amplitude-modulated with a deviation of about 0.1% over the injection stream, or when external intensity modulation is performed, the result is sidebands spaced apart by the frequency of the clock-pulse signal from carrier 21 or 22 (FIG. 8). Of these sidebands only one sideband 27, 28 is shown in FIG. 8. For the sake of clarity, the amplitudes of sidebands 27, 28 have been shown as darkened lines in relation to the amplitudes of carriers 21, 22.

Since in the proximity of the frequency of free-running slave laser 2, an extremely low injection suffices to lock the slave laser, only a slight degree of modulation of the master laser is needed to induce the slave laser to lock onto the particular sideband 27 or 28. Thus, the output signal from slave laser 2 is able to be modulated synchronously, i.e., of those waves shown in FIG. 9, individual waves can be suppressed or allowed to pass through by modulator 9, depending on the information content of the modulation signal. The existing phase noise that occurs in source 11 for the modulation signal and the clock-pulse signal only slightly affects the curve shape of the modulated signal.

Figure 4:
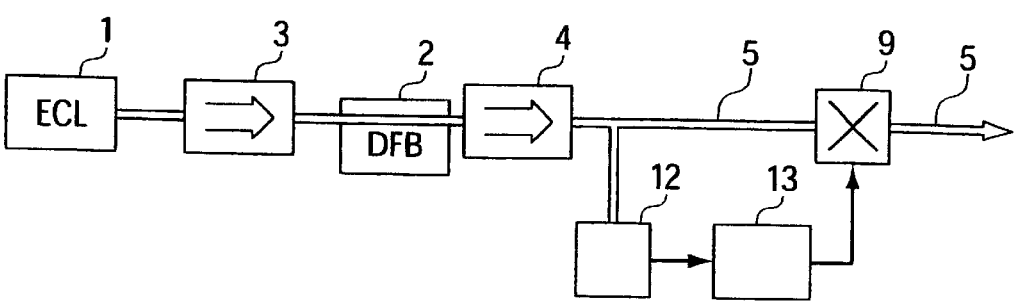
FIG. 4 shows a further embodiment of the present invention for generating a high-frequency optical signal.

In the exemplary embodiment shown in FIG. 4, lasers 1, 2 are operated in the manner explained already in connection with FIGS. 1 and 2. In this context, master laser 1 is not modulate. Besides being fed to modulator 9, however, the output signal from slave laser 2 is also fed to a clock-pulse generator 12 where it is used to derive a clock-pulse signal for source 13 for the modulation signal. It is possible for providing the modulated signal to be distributed via fiber optic guides 5, as in the embodiment shown in FIG. 3.

Figure 5:
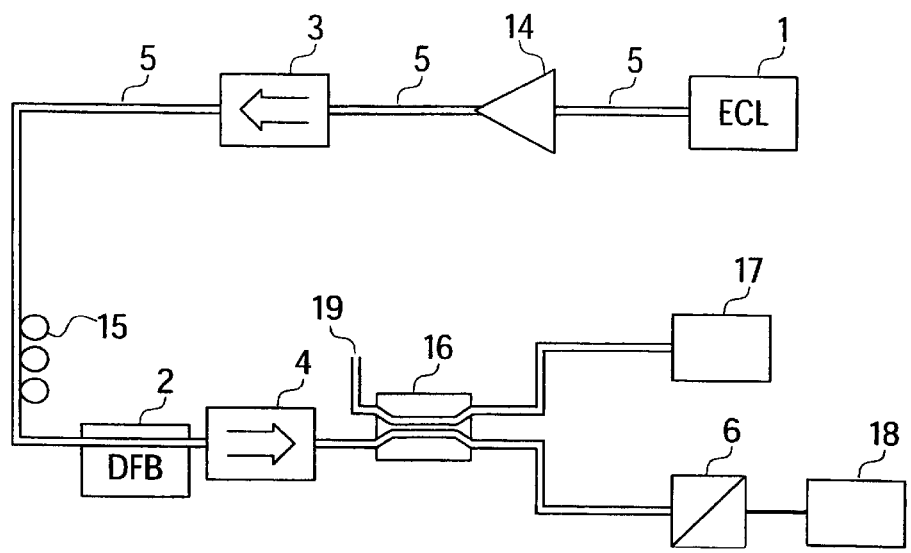
FIG. 5 shows a generator according to the present invention configured as a test arrangement.

Similarly in a block diagram, FIG. 5 shows a test arrangement, which differs from the other embodiments shown in that a number of fiber optic guides 15, an amplifier 14, a polarizer 15, a directional coupler 16, an optical spectrum analyzer 17, and an electrical spectrum analyzer 18 have been added. Polarizer 15 is used to cancel the depolarization that occurs in series-connected fiber optic guides 5. The other exemplary embodiments do not include using a polarizer of this kind, since they provide for using polarization-maintaining fiber optic guides. The output signal from slave laser 2 is fed to the optical spectrum analyzer 17 with the aid of directional coupler 16 and also to the electrical spectrum analyzer 18 via photoelectric transducer 6. This enables both the optical spectrum as well as the electrical spectrum of the output signal from slave laser 2 to be measured simultaneously. A PIN photodiode is used as the photoelectric transducer and has a bandwidth of 45 GHz.

Given a biasing current 2.7 times the threshold current of slave laser 2, and given a ratio of 0.1 to 0.5 of injected power to the power of slave laser 2, the range of locking is from about 10 GHz to 30 GHz when the master laser frequency is greater than the slave laser frequency. If one selects the difference in the frequency between the two lasers to be greater than the locking range under these conditions, then two separate spectral lines are produced at the output of the slave laser. These two frequencies generate the optical output signal. The resulting frequency is not identical to the differential frequency of the two free-running lasers, as has already been explained with reference to FIG. 8. The reason for this is a change in (pulling of) the mean optical frequency of the slave laser field, produced by the injection. Both for positive as well as negative frequency differences (detuning), oscillation frequencies of the slave-laser's output signal from 7 GHz to 45 GHz are measured using a high-speed photodiode, which is limited in the test arrangement shown in FIG. 5 by the bandwidth of PIN photodiode 6. The line width at the (−3 dB) points is below 100 kHz when the master laser is an ELC laser.

Evidence that the phase noise is reduced is provided by a measurement performed using the test arrangement shown in FIG. 5, as follows: if the path of rays is interrupted downstream from optical amplifier 14 at the output of master laser 1, and if this output is connected to terminal 19 of directional coupler 16, then observe the normal superimposition of the two free-running lasers may be observed on electrical spectrum analyzer 17. Here, the measured line width is 2.2 MHZ, which closely approximates the line width of slave laser 2, since the line width of master laser 1 is only about 100 kHz to 150 kHz.

This illustrates how the light from the master laser, which passes together with the slave-laser light through the resonator of the slave laser, results in increased mutual coherence. This leads to a narrower oscillation-frequency line width, since both wave fields are coupled to the same reservoir of charge carriers. The charge carriers in this joint reservoir influence the refractive index of the resonator and, thus, mutually affect the phases of both fields. A correlation of this kind is responsible for the observed greater mutual coherence. Measurements performed using an electronic spectrum analyzer produce oscillation-frequency line widths of 600 Hz. However, this low value is conditional only upon the properties of the generator that produces the sidebands in the master laser.

Figure 6:
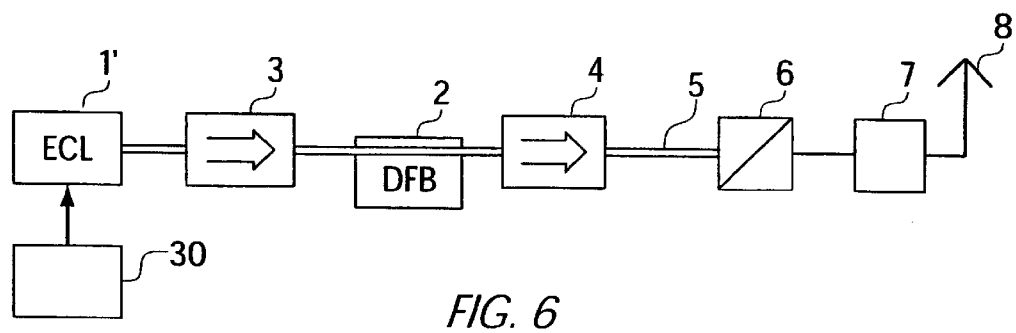
FIG. 6 shows an embodiment of the present invention for generating a modulated microwave carrier.

As the master laser, the exemplary embodiment of FIG. 6 provides a DFB laser 1', which is driven from a source 30 via an analog-modulated, frequency-modulated or phase-modulated electrical signal. This direct modulation of laser 1' is converted into a corresponding optical signal and injected into slave laser 2. In a corresponding fashion, slave laser 2 produces an optical microwave signal having the same modulation which can be transmitted via optical fibres.

Figure 7:
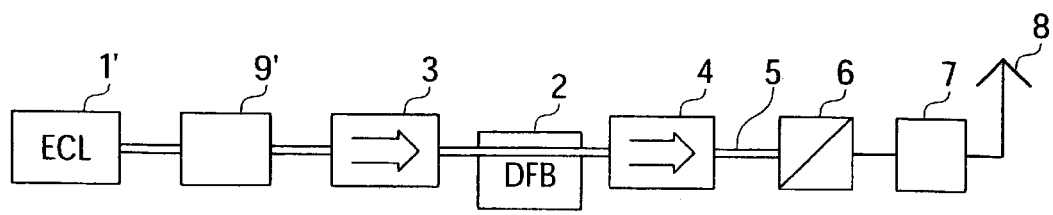
FIG. 7 shows a further embodiment of the present invention for generating a modulated microwave carrier.
Figure 8:
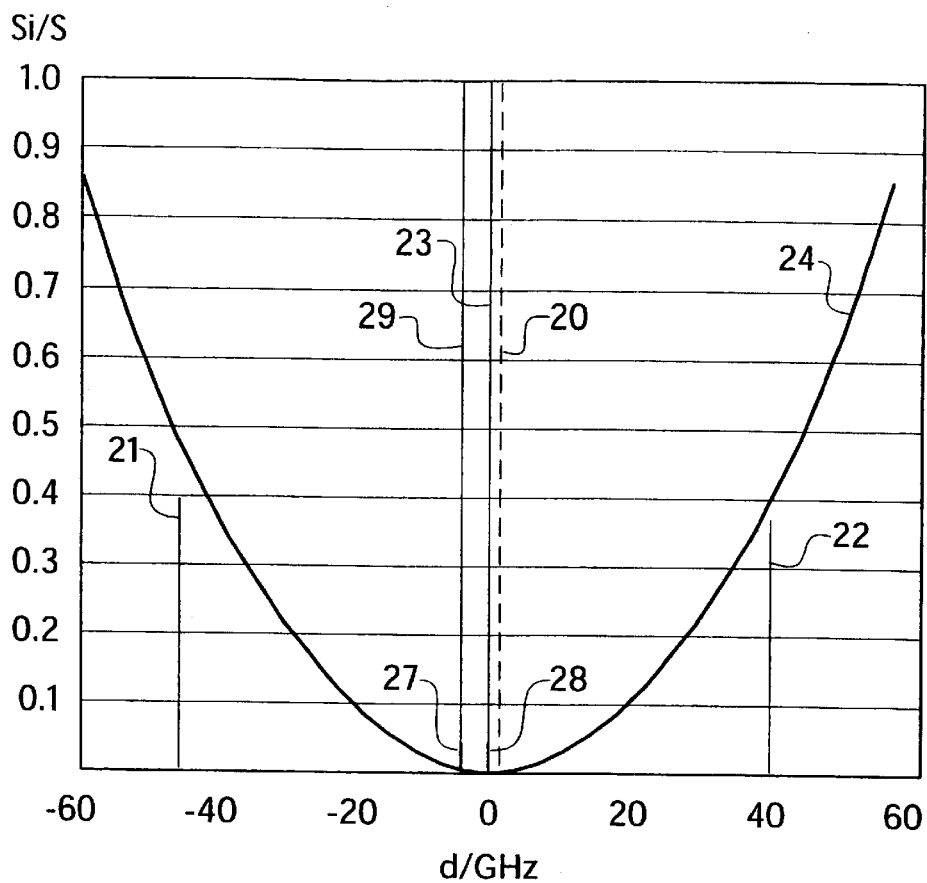
FIG. 8 shows a representation of the locking characteristics of the second laser in the present invention.

The exemplary embodiment according to FIG. 7 similarly includes a modulation of the output signal from master laser 1', and thus, of the injected signal. However, an external optical modulator 9' is used. The intensity of the amplitude-phase coupling determines whether just an amplitude modulation can take place, or whether a phase or frequency modulation can take place as well. Moreover, with the aid of external optical modulator 9', it is also possible to perform a modulation using a suitable frequency to lock slave laser 2 to the sideband, as described in conjunction with FIG. 8.

Modulation using the modulation signal ultimately provided for transmission can be performed as analog or digital modulation. The modulation carried out in accordance with the exemplary embodiment shown in FIG. 7 results in an extremely phase-stable optical carrier that contains analog or digital modulation. The external amplitude modulation can be converted in his case into a frequency or phase modulation.

What is claimed is:

1. A generator for producing a low-noise, high-frequency generator output signal, comprising:

a monomode first laser having a first free-running frequency and producing light;

a second laser having a second free-running frequency and producing a second laser output signal, the first laser being connected via an optical isolator to the second laser, the light produced by the first laser being injected as injected light into the second laser;

wherein an intensity of the injected light and a difference between the first free-running frequency and the second free-running frequency are selected so as to prevent the second laser from locking onto the first free-running frequency; and wherein the second laser oscillates during injection at a frequency that is slightly smaller than the second free-running frequency, the second laser output signal exhibiting a substantial modulation depth with a modulation frequency of about the difference between the first free-running frequency and the second free-running frequency.

2. The generator as recited in claim 1, wherein the first laser includes an external resonator.

3. The generator as recited in claim 1 wherein the second laser includes distributed feedback.

4. The generator as recited in claim 1 further comprising a photoelectric transducer connected to an output of the second laser.

5. The generator as recited in claim 1 wherein the first laser is modulated with a modulation frequency corresponding to a frequency of the generator output signal, the modulation producing a sideband, the second laser is locked onto the sideband, and the second laser output signal is capable of being modulated with a digital modulation signal having a clock pulse corresponding to the modulation frequency.

6. The generator as recited in claim 1 further comprising an input signal fed to the first laser, and wherein an output signal from the first laser and the generator output signal are modulated using the input signal.

7. The generator as recited in claim 1 further comprising an external optical modulator for modulating an output signal from the first laser.

8. The generator as recited in claim 1 further comprising an optical transmission device, and wherein the second laser output signal is capable of being fed to the optical transmission device.

9. The generator as recited in claim 1 further comprising an optical modulator and a clock-pulse generator, and wherein the second laser output signal is capable of being fed to the optical modulator and to the clock-pulse generator for producing a digital modulation signal for the optical modulator.

10. The generator as recited in claim 4 further comprising a second optical isolator linking the output of the second laser and an input of the photoelectric transducer.

11. The generator as recited in claim 4 further comprising an optical modulator connected in series to the photoelectric transducer.

12. The generator as recited in claim 5 further comprising an input signal fed to the first laser, and wherein an output signal from the first laser and the generator output signal are modulated using the input signal.

13. The generator as recited in claim 6 wherein the first laser is modulated directly.

* * * * *